(12) United States Patent
Harris

(10) Patent No.: US 6,870,382 B2
(45) Date of Patent: Mar. 22, 2005

(54) SYSTEM AND METHOD FOR EVALUATING THE PLANARITY AND PARALLELISM OF AN ARRAY OF PROBE TIPS

(75) Inventor: Michael P. Harris, Garland, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/138,388

(22) Filed: May 3, 2002

(65) Prior Publication Data

US 2003/0206031 A1 Nov. 6, 2003

(51) Int. Cl.[7] .............................................. G01R 31/02
(52) U.S. Cl. .................... 324/758; 324/158.1; 324/757; 324/759; 33/533
(58) Field of Search ................................ 324/758, 757, 324/756, 158.1; 33/533, 415; 702/44, 119, 123, 121; 29/870; 219/121.82, 121.79

(56) References Cited

U.S. PATENT DOCUMENTS 4,660,294 A * 4/1987 Schmidt ....................... 33/533
4,751,457 A * 6/1988 Veenendaal ................. 324/73.1

* cited by examiner

Primary Examiner—Kamand Cuneo
Assistant Examiner—Trung Q. Nguyen
(74) Attorney, Agent, or Firm—Wade James Brady, III; Frederick J. Telecky, Jr.

(57) ABSTRACT

A system includes a support member and a computer system. The support member holds and retains a probe card, which has an array of probe tips extending therefrom. The computer system includes a software program. The software causes the computer system to perform a method including the following. A position where electrical contact occurs between at least some of the probe tips of the probe tip array and a selected surface is determined through testing. Data for the positions where electrical contact occurs is recorded. The recorded data is sorted for a shortest distance where electrical contact occurred between each probe tip tested and the selected surface during the testing. The sorted data group is plotted on a three dimensional cartesian coordinate system. The system may be used for evaluating the planarity of the probe tip array and parallelism of the probe tip array relative to the selected surface.

29 Claims, 9 Drawing Sheets

… (1/2)

SYSTEM AND METHOD FOR EVALUATING THE PLANARITY AND PARALLELISM OF AN ARRAY OF PROBE TIPS

TECHNICAL FIELD

The present invention relates to a system and method for evaluating the planarity of an array of probe tips and the parallelism of the probe tip array relative to a selected surface. In one aspect, it relates to a software program for displaying data indicating the planarity and parallelism of an array of probe tips for use in testing semiconductor devices.

BACKGROUND

A probe card having an array of probe needles extending therefrom is typically used to test dies on a wafer of semiconductor devices to identify faulty dies. Such testing is often done before cutting the dies from the wafer and before packaging the dies into finished semiconductor components. The probe card provides temporary electrical contact between the die and a tester. The electrical contact with the die is made with probe tips of the probe needles.

FIG. 1 is simplified schematic showing a typical flipped-head probe testing machine 30 with a probe card 32 therein. A ring insert 34 is used to hold the probe card 32 in place in a head plate 36. A test head 38, which contains the tester circuitry (not shown), is electrically coupled to the top side of the probe card 32 via an array of pogo-pins 40. In the flipped-head probe testing machine 30 shown in FIG. 1, the probe card 32 and test head 38 remain fixed during use, and a wafer 42 is positioned relative to the probe card 32 on a movable wafer chuck 44. The wafer chuck 44 moves within the flipped-head probe testing machine 30, wherein wafers can be loaded and moved into position for testing. Manually adjustable head plate support columns 46 hold the head plate 36 and probe card 32 in place. During setup of the flipped-head probe testing machine 30, the head plate 36 is adjusted parallel with the wafer chuck 44 by manually adjusting the height of the head support columns 46.

The array of probe tips 48 of the probe needles 50 are typically arranged in a pattern matching the layout of the bond pads or bumped pads (e.g., for a ball-grid array) of a particular die design. For example, the array of probe needles 50 may be arranged in a square pattern for a single large die that is 1.1 inches diagonally across the square. In another application, the array of probe needles 50 may be arrange in three square patterns with a diagonal distance of 1.2 inches across the three squares for testing three dies at once, for example. Hence, a probe card 32 may have hundreds or even thousands of probe needles 50. As the technology of semiconductor devices progress, the number bond pads or bumped pads typically increases and the size of the individual pads typically decreases, while the cost of such semiconductor devices are expected to decrease. Thus, the demands on the precision of probe cards and the complexity of probe cards have escalated. Hence, a need exists for more precisely aligning a probe card with a die.

The increase in complexity of probe cards has led to increases in the cost of probe cards. For example, a typical probe card in the past may have cost only about $500–$2500. In contrast, today a probe card may cost as much as $60,000. The cost of probe cards can lead to costs in the millions per month for semiconductor manufacturers. Hence, there is an increased need for increasing the life of probe cards.

BRIEF SUMMARY OF THE INVENTION

The problems and needs outlined above are addressed by certain aspects of the present invention. In accordance with one aspect of the present invention, a method of evaluating the planarity of an array of probe tips on a probe card and parallelism of the array of probe tips relative to a selected surface is provided. The method includes the following steps, the order of which may vary. First, the probe tip array and/or the selected surface are moved relative to each other in spaced increments. Second, electrical contact between at least some of the probe tips and the selected surface is tested for at least some of the increments. Third, for each probe tip tested at a given increment, data is recorded indicating whether electrical contact occurs between the tested probe tips and the selected surface. Fourth, the recorded data is sorted to create a sorted data group comprising a shortest distance where electrical contact occurred between each probe tip tested and the selected surface during the testing. Fifth, the sorted data group is plotted on a three dimensional cartesian coordinate system, wherein x and y values for each data point generally correlate to a location of a corresponding probe tip relative to the other probe tips, and wherein a z value for each data point is a shortest distance where electrical contact occurred between the corresponding probe tip and the selected surface during the testing. The spacing between the increments may be the same, or the spacing between the increments may vary among at least some of the increments, for example. The selected surface may move toward the probe tip array in a direction generally perpendicular to the selected surface, for example. The selected surface may be an array of bond pads formed on a semiconductor wafer, an array of bumped pads formed on a semiconductor wafer, a wafer, a reference plate used for calibration, a cleaning plate, or a plate with an abrasive and electrically conductive surface, for example. The method may further comprise the step of plotting a histogram for the sorted data group, wherein the histogram has a first axis for the shortest distance where electrical contact occurred between each probe tip tested and the selected surface during the testing, and the histogram has a second axis for the number of data points with like shortest distances at each tested increment for the sorted data group. Also, the method may further comprise the step of rotating the cartesian coordinate system to view the plotted data from a different angle. The method may also be used while producing a semiconductor device to test at least a portion of the semiconductor device.

In accordance with another aspect of the present invention, a method of simulating the results of tilting a probe card relative to a selected surface is provided. This method includes the following steps, the order of which may vary. First, data is plotted on a three dimensional cartesian coordinate system, wherein x and y values for each data point generally correlate to a location of a corresponding probe tip of an array of probe tips on the probe card relative to other probe tips on the probe card, and wherein a z value for each data point is a shortest distance where electrical contact occurred between the corresponding probe tip and the selected surface during testing for electrical contact between the probe tip array and the selected surface. Second, the tilt of the probe tip array is evaluated based on a plot of the data on the cartesian coordinate system. Third, the data is tilted on the cartesian coordinate system to simulate an actual tilting action possible on a testing machine housing the probe card. Fourth, the tilted data is replotted on the cartesian coordinate system.

In accordance with yet another aspect of the present invention, a method of aligning a cleaning surface with an array of probe tips on a probe card is provided. This method includes the following steps, the order of which may vary.

First, an electrically conductive cleaning surface is provided. Second, a position where electrical contact occurs between at least some of the probe tips of the probe tip array and the cleaning surface is tested. Third, data for the positions where electrical contact occurs for each tested probe tip is recorded. Fourth, the recorded data is sorted to create a sorted data group comprising a shortest distance where electrical contact occurred between each probe tip tested and the cleaning surface during the testing. Fifth, the sorted data group is plotted on a three dimensional cartesian coordinate system, wherein x and y values for each data point generally correlate to a location of a corresponding probe tip relative to the other probe tips, and wherein a z value for each data point is a shortest distance where electrical contact occurred between the corresponding probe tip and the cleaning surface during the testing. Sixth, the tilt of the cleaning surface relative to the probe tip array is evaluated based on a plot of the sorted data group on the cartesian coordinate system. Seventh, if needed, the tilt of the cleaning surface relative to the probe tip array is adjusted based on the evaluation.

In accordance with still another aspect of the present invention, a system is provided, which includes a support member and a computer system. The support member is adapted to hold and retain a probe card. The probe card has an array of probe tips extending therefrom. The computer system includes a software program. The software program provides instructions for causing the computer system to perform a method, which includes the following steps (the order of the steps may vary). First, a position where electrical contact occurs between at least some of the probe tips of the probe tip array and a selected surface is determined through testing. Second, data for the positions where electrical contact occurs for each tested probe tip is recorded. Third, the recorded data is sorted to create a sorted data group comprising a shortest distance where electrical contact occurred between each probe tip tested and the selected surface during the testing. Fourth, the sorted data group is plotted on a three dimensional cartesian coordinate system, wherein x and y values for each data point generally correlate to a location of a corresponding probe tip relative to the other probe tips, and wherein a z value for each data point is a shortest distance where electrical contact occurred between the corresponding probe tip and the selected surface during the testing. The system may also include a wafer chuck for supporting and moving a wafer relative to the probe tip array, and in such case the selected surface may be the wafer, for example. The system may include a cleaning plate having a cleaning surface, and in this case the selected surface may be the cleaning surface of the cleaning plate. The support member may include a head plate supported by support columns and a ring insert fitting within the head plate, for example. In such case, the probe card may fit within and may be retained by the ring insert. As another example, the head plate may be supported by electrically controllable actuators, and in such case, the method may further include the steps of controlling the movement and position of the actuators, and adjusting the tilt of the head plate relative to the selected surface using the actuators. The method may include steps of simulating the insertion of a shim between the probe card and the support member, and replotting the sorted data group on the cartesian coordinate system after simulating the shim insertion.

BRIEF DESCRIPTION OF THE DRAWINGS

The above features of the present invention will be more clearly understood from consideration of the following descriptions in connection with accompanying drawings in which.

DETAILED DESCRIPTION OF PREFERRED EMBODIMENTS

Figure 1:
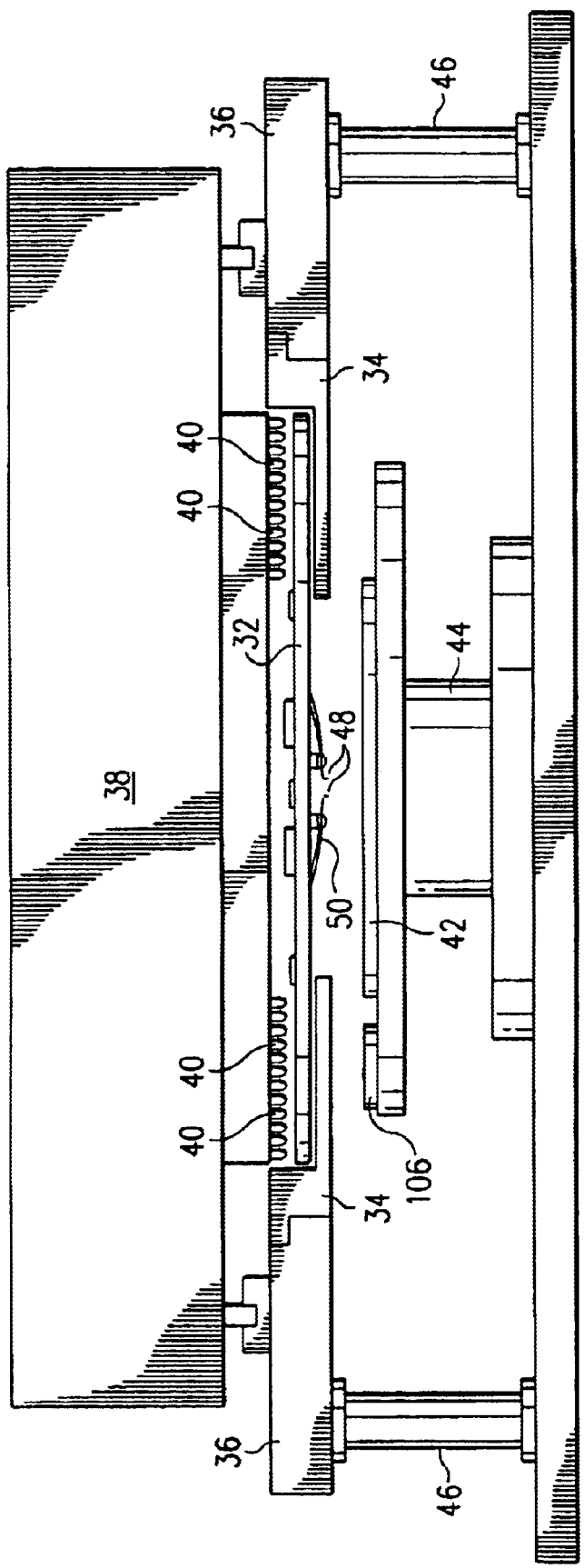
FIG. 1 is a side view of a typical probe testing machine.

Referring now to the drawings, wherein like reference numbers are used herein to designate like elements throughout the various views, preferred embodiments of the present invention are illustrated and described. As will be understood by one of ordinary skill in the art, the figures are not necessarily drawn to scale, and in some instances the drawings have been exaggerated and/or simplified in places for illustrative purposes only. One of ordinary skill in the art will appreciate the many applications and variations of the present invention in light of the following description of preferred embodiments of the present invention. A discussion of some advantages of preferred embodiments of the present invention follows. The preferred embodiments discussed herein are illustrative examples of the present invention and do not limit the scope of the invention to the preferred embodiments described.

Generally, an embodiment of the present invention provides a system and method for evaluating the planarity of an array of probe tips and the parallelism of the probe tip array relative to a selected surface. A first embodiment of the present invention is shown in FIGS. 2–17. FIG. 1 is also used in describing the first embodiment because the first embodiment may be implemented into existing equipment.

While testing dies with a probe card 32, numerous alignments and geometric configurations need precision. For purposes of discussion, assume that the surface of the wafer 42 (with dies thereon) lies in an x-y plane and a z axis or direction extends generally perpendicular from the x-y plane, i.e., the surface of the die and wafer 42. Alignment in the x and y directions is important so that each probe needle tip 48 contacts its respective bond pad or bumped pad on the die being tested. Probe tip planarity is another important consideration.

Probe tip planarity refers to whether the probe tips 48 all lie on the same plane. Preferably, all of the probe tips 48 lie on the same perfectly flat plane. But typically, there is slight variation and the probe tips 48 are not perfectly planar on a micron scale. Parallelism is yet another important consideration. Fixture parallelism refers to whether the ring insert 34 and/or the head plate 36 (see FIG. 1) are parallel to the wafer 42 and/or the wafer chuck 44. Array parallelism refers to whether an array of probe tips 48 is parallel to the die and/or the wafer 42.

Currently, parallelism is determined by a combination of measurements performed on the wafer chuck 44, measurements performed on the probe card support fixtures (i.e., ring insert 34 and/or head plate 36), and parallelism maintained by the probe manufacturer between the probe card 32 (where it is supported and held by the fixtures) and the probe tip array 48 during the building of the probe card 32. Thus, there is an assumption that the probe card support surface is parallel with the probe tip array 48, and that the probe tip planarity is within tolerance when the probe cards are received from the probe manufacturer.

One of the current methods of testing for the tilt (i.e., parallelism) of an array of probe tips 48 is to detect the first touch of a probe tip 48, detect the last touch of a probe tip 48, and report the difference. The difference reported indicates the relative parallelism of the probe card 32 to the wafer 42. However, this type of testing does not distinguish between planarity and parallelism. For example, if the head plate 36 is measured to be parallel to the wafer chuck 44, but the difference reported between first touch and last touch exceeds an acceptable tolerance, it is assumed that the probe card 32 is defective and there is a planarity problem. Parallelism problems can be fixed by adjustment of the fixtures, which is relatively fast and inexpensive. On the other hand, planarity problems indicate that the probe card 32 needs to be rebuilt or retired, which is relatively slow and costly. Thus, if a planarity problem can be distinguished from a parallelism problem, cases where there is only a parallelism problem can be easily remedied and less probe cards will be rejected as faulty or out of tolerance.

Some probe companies offer optical solutions, which can report the z positions where mechanical contact occurs for each probe tip. However, optical solutions are very slow and thus not feasible in a production environment. Also, the optical measurements do not report where electrical contact occurs. This is especially important for vertical, piston-configured probe cards, where the probe needles or pins float and do not make electrical contact until the probe pin is sufficiently pressed against the pad. Also, with cantilever style probe needles 48, as shown in FIG. 1, the point of electrical contact (z-location of probe card 32 where electrical continuity exists between a probe needle 50 and a selected surface) typically differs from the point of mechanical contact (z-location of probe card where probe tip 48 first physically contacts the selected surface). The electrical contact occurs when the probe tip 48 penetrates or scratches through the resistive layer of oxide that tends to build up on the bond pads or bumped pads as the cantilever probe needle 50 flexes and gradually presses harder against the pad. The difference between the z position of electrical contact and the z position of mechanical contact for a cantilever-style probe needle is significant because it is nearly equal to the typical parallelism tolerance for the probe card. The electrical contact is also more important because it is the electrical contact between the probe tips 48 and the die pads that is needed to test the dies, rather than mere mechanical contact. Thus, it is more desirable to measure the point of electrical contact than the point of mechanical contact.

A standard continuity test currently used elevates the wafer chuck 44 to a single z position (e.g., operation level) and reports if any probe needles 50 are failing (i.e., not making electrical contact). This generates one elevation data point for each probe needle 50, which is used to evaluate the planarity of the probe tips 48. The data from this test is presented in a table format, which makes it nearly impossible to determine the planarity pattern of the probe tips 48.

A first embodiment of the present invention provides a software application and a method for evaluating the planarity of an array of probe tips 48 and the parallelism of the probe tip array 48 relative to a die on a wafer 42 while in the test environment. In other words, the first embodiment provides information about how the probe card 32 is situated while in the actual probing environment for testing a die during production.

The method of evaluation for the first embodiment has the following procedure, which may be implemented with existing equipment (see FIG. 1). For purposes of discussion of the first embodiment, it will be assumed that the die is aligned with the probe tip array in the x-y plane. The wafer chuck 44 is moved in the z direction toward the probe card 32 (and hence toward the probe tip array 48) in incremental steps as the die gets close to mechanically contacting at least one probe tip 48 or after the first mechanical contact is made (e.g., this could be determined using optical method). The die is moved in one micron increments towards the probe tip array 48, for example. The spacing between increments may vary among increments, or the spacing between each increment may be the same. Also, the spacing may be another distance other than one micron. At each increment (or in alternative at only some of the increments), the probe needles 50 are tested to determine whether electrical contact is occurring between each probe tip 48 and the corresponding bond pad or bumped pad on the die being tested. Preferably each probe tip 48 is tested at each increment. In alternative, only some of the probe tips 48 may be tested at only some of the increments, for example. For each probe tip 48 tested at a given increment, data is recorded as to whether electrical contact occurred. Then, the recorded data is sorted to create a sorted data group of the data points having the shortest distance between each probe tip 48 and the die where electrical contact occurred relative to a reference position (e.g., z position of first mechanical contact, or lowest position for wafer chuck 44).

Figure 2:
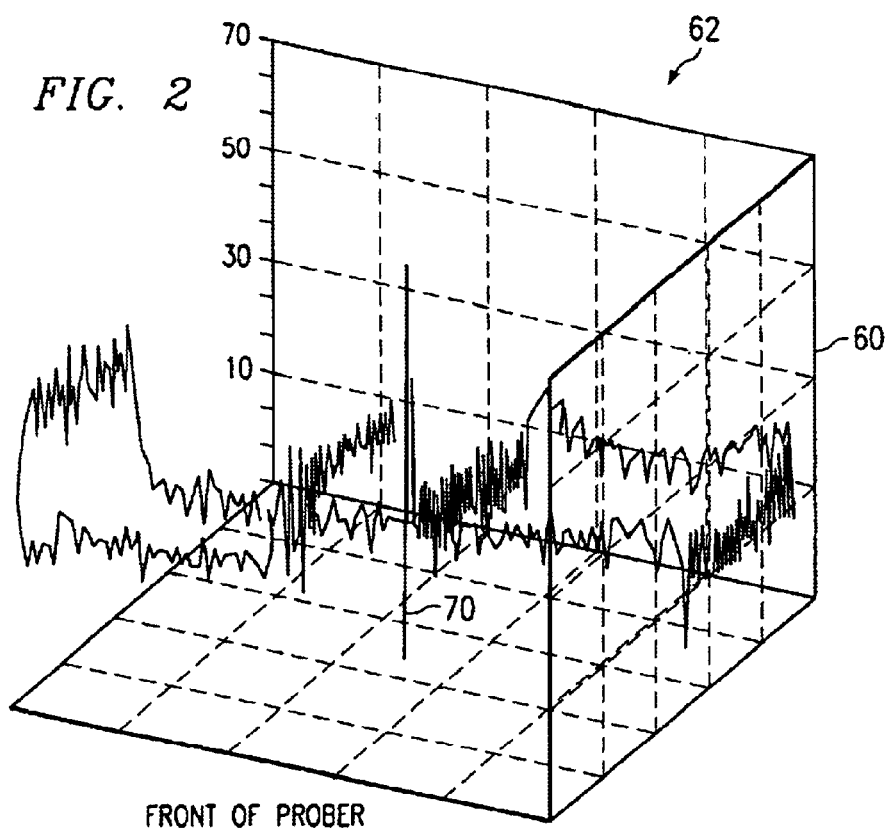
FIG. 2 is a perspective view of a three dimensional plot of sorted data using the first embodiment of the present invention.
Figure 3:
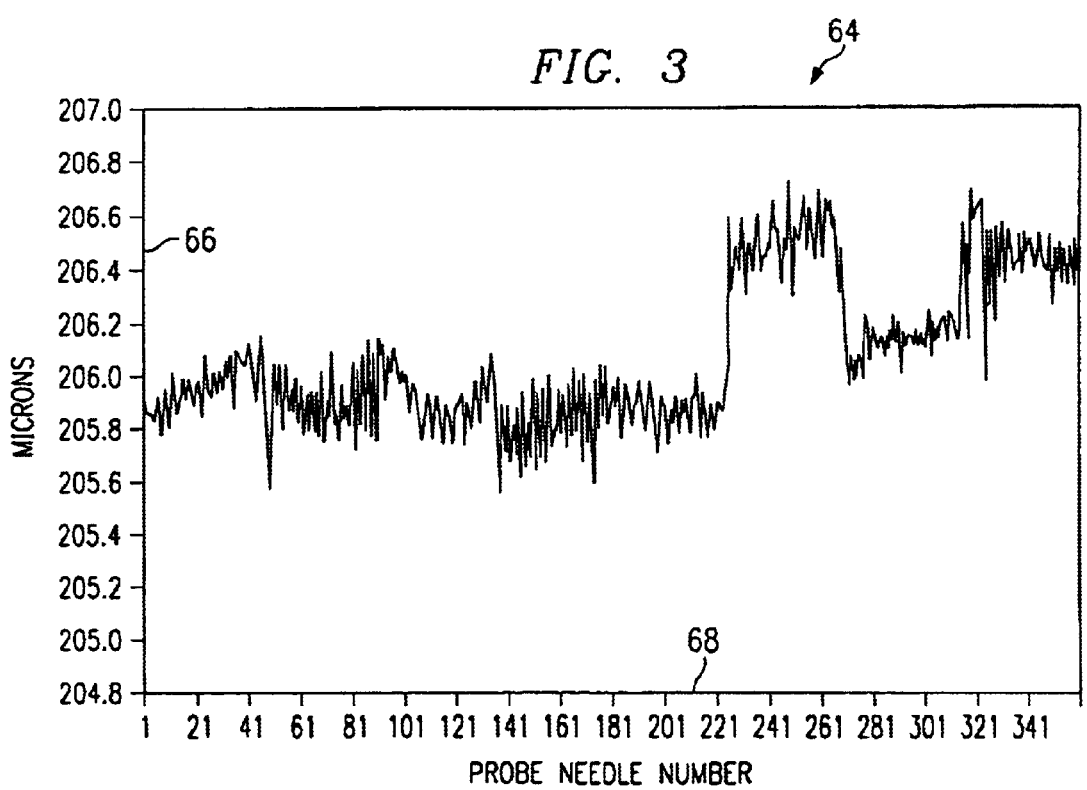
FIG. 3 is a two dimensional plot of the same sorted data plotted in FIG. 2.

As shown in FIG. 2, the sorted data group is then plotted on a three dimensional cartesian coordinate system 60. The x and y values for each data point correlate to the x and y positions the corresponding probe tip relative to the other probe tips. The z value for each data point of the sorted group is the first occurrence of electrical contact between a probe tip 48 and the wafer 44. The scale of the z axis is in microns. Hence for each probe tip 48 tested, a data point is plotted for its first electrical contact position as the wafer 44 moves towards the probe tip array 48. The three dimensional plot 62 of the sorted data group provides a unique perspective on the data recorded. FIG. 3 shows a two dimensional plot 64 of the same data points of FIG. 2. The vertical axis 66 of FIG. 3 is the z direction in a scale of microns. The horizontal axis 68 of FIG. 3 is the probe needle number assigned to each probe needle 50. In comparison, the two dimensional plot of the sorted data group shows the variations in the direction for first electrical contact (vertical axis, z-direction). But, the three dimensional plot of FIG. 2 provides a visualization of the contour and pattern of the probe tip planarity and the location (in the x-y plane) of the high and low areas.

In alternative, the sorted data may be plotted on a polar coordinate system or a spherical coordinate system, for example, but the data is more conducive to a cartesian coordinate system. Hence, a cartesian coordinate system is preferred.

In the graph of FIG. 2, a line is drawn between each data point and its subsequent data point for the purpose of better illustrating the relative locations of the data points. Note in FIG. 2 that a vertical line 70 extends at the center of the x-y plane from −10 to 60 in the z direction. Two artificial data points are added to the sorted data group at the beginning of the sorted data with z values of −10 and 60 microns for the purpose of causing the auto-scaling feature of the software to plot each sorted data group on a same scale for consistent viewing from test to test. Other means of setting the scale of the plot may be implemented in other embodiments.

The software program of the first embodiment provides the ability to rotate the plot 62 shown in FIG. 2 to view the plotted data from different sides and angles. This allows the sorted data to be viewed from different sides of the probe card 32 (e.g., top view, right side view, left side view, front view, back view, and perspective views). By just viewing the two dimensional plot 64 of FIG. 3, it is very difficult to discern whether there is any tilt to the probe tip array 48. In contrast, viewing the three dimensional plot 62 of FIG. 2 from different sides and angles will quickly reveal tilt and it allows a user to discern planarity problems from parallelism problems. Without knowing whether planarity or parallelism is the problem, an operator may reject a probe card 32 when only slight tilt adjustments are needed.

Figure 4:
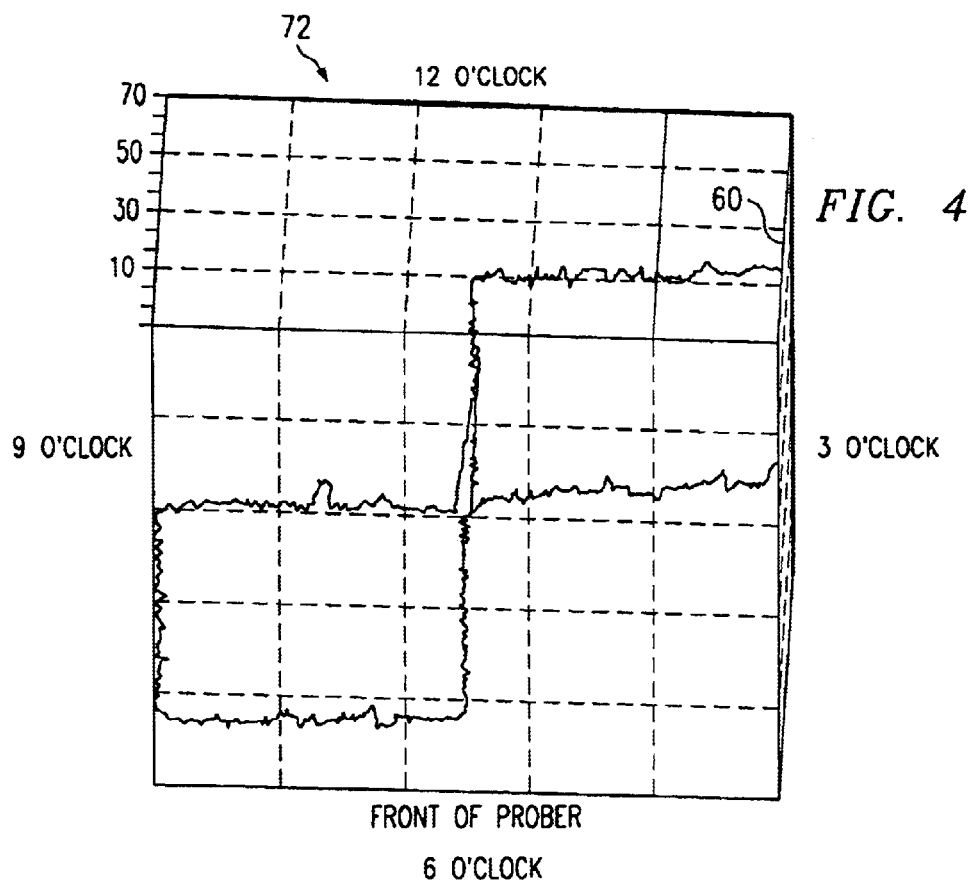
FIG. 4 is a top perspective view of another set of sorted data plotted using the first embodiment of the present invention.

FIG. 4 shows a top perspective view for a three dimensional plot 72 of another set of sorted data from a different test using the first embodiment. As shown in the perspective view of FIG. 4, the probe tip array 48 is arranged in a pattern of two squares for testing two dies at a time. For convenience, the x-y plane is labeled with clock designations (3 o'clock, 6 o'clock, 9 o'clock, and 12 o'clock) to identify different sides of the probe tip array 48. The front of the prober is designated as 6 o'clock, which is where the operator typically stands while running the machine 30. Generally, the prober is the machine that positions and presents the wafer 42 to the probe card 32, which may include (see FIG. 1) the wafer chuck 44, the ring insert 34, the head plate 36, and the support columns 46, for example. The probe card 32 is typically positioned with pins to ensure that the probe card 32 has the proper orientation relative to the other components. Thus, the orientation of the probe card 32 and its probe tip array 48 may conveniently referenced or determined relative to the orientation of the prober. The clock positions will come into use in the discussion below.

Figure 5:
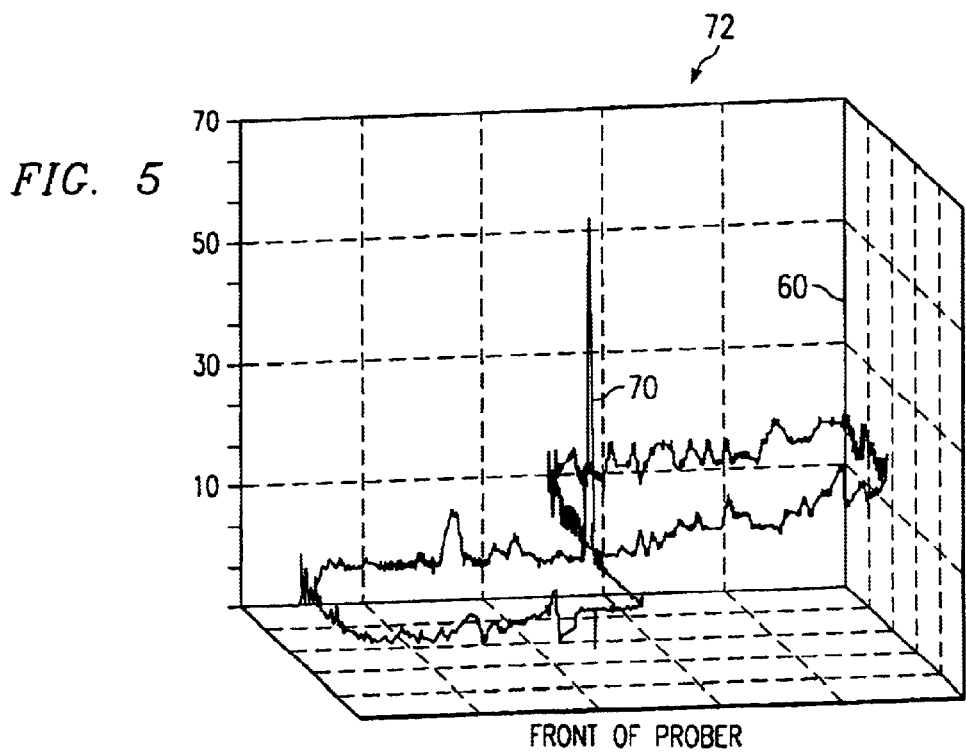
FIG. 5 is a front perspective view of the plot shown in FIG. 4.
Figure 6:
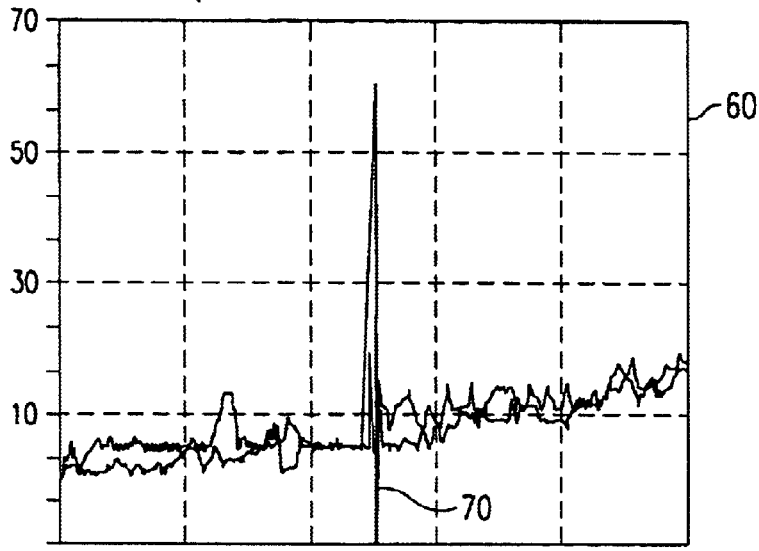
FIG. 6 is a front view of the plots shown in FIGS. 4 and 5.

FIG. 5 is another perspective view of the sorted data plotted in FIG. 4. FIG. 6 is a front view (from 6 o'clock to 12 o'clock) of the sorted data plotted in FIGS. 4 and 5. FIGS. 4–6 illustrate how the same data may provide different information and visualizations when rotated and viewed from different angles in the rotatable three dimensional plot 72. The angle of view of the plot in FIG. 6 shows that the probe tip array 48 is tilted from 9 o'clock to 3 o'clock. FIG. 6 also shows that the planarity of the probe tip array 48 is good, and provides a clear indication that the major problem in this case is parallelism, not planarity. This is very helpful in detecting setup problems, which can be fixed by adjustments. It is much easier to remedy parallelism problems than to repair planarity problems. In general, the better the parallelism, the better the probe card 32 will perform.

The first embodiment may be used for a variety of situations, such as: testing or calibrating a probe card 32 after or while making the probe card 32 by a probe card marker; testing, adjusting, or calibrating a probe card 32 by an analyzer before delivering the probe card 32 to a user; aligning or calibrating the flipped-head probe testing machine 30 using a reference plate; aligning the probe card 32 with a cleaning plate (discussed further below); and/or aligning the probe card 32 with an actual die or dies on a wafer 42 while testing actual semiconductor products that will be sold, for example. With the benefit of this disclosure, one of ordinary skill in the art will realize these and perhaps many other uses and benefits of an embodiment of the present invention.

Figure 7:
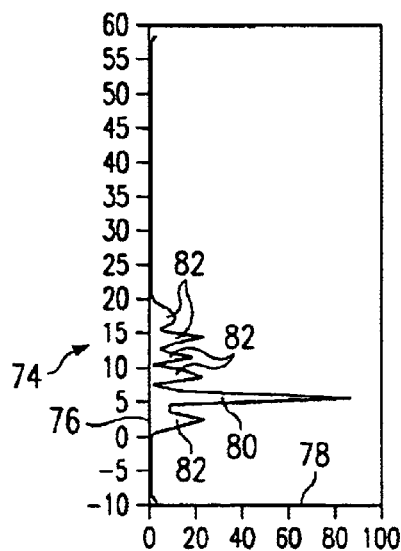
FIG. 7 is a histogram for the sorted data plotted in FIGS. 4–6.

FIG. 7 is a histogram 74 of the sorted data plotted in FIGS. 4–6. The vertical axis 76 of the histogram 74 is a scale for the z direction in microns, and the horizontal axis 78 is the number of data points for a given z location (i.e., number of first electrical contacts per increment recorded). A practical goal for the histogram plot 74 is to have a tight Gaussian distribution (bell curve). In other words, it is most desirable to have the less variations in the z direction for the location of first electrical contact. The histogram 74 of FIG. 7 has one large spike 80 at about 6 microns, and five smaller spikes 82 at about 17, 14, 12, 8, and 2 microns.

The software application of the first embodiment provides the ability to simulate the insertion of a shim (not shown) between the probe card 32 and the ring insert 34 for tilting the probe tip array 48. In practice, a thin sheet (the shim) (not shown) can be inserted between the probe card 32 and the ring insert 34 (where the probe card 32 sits on the ring insert 34) at a location, quadrant, or side that needs to be raised to adjust for tilt. To actually insert a shim, it may take 5–20 minutes to insert the shim and re-set-up the testing machine for use. And, it may take several tries to get the right amount of shim for correcting the tilt. Thus, the ability to simulate the insertion of a shim with the software program may save a lot of time.

Figure 8:
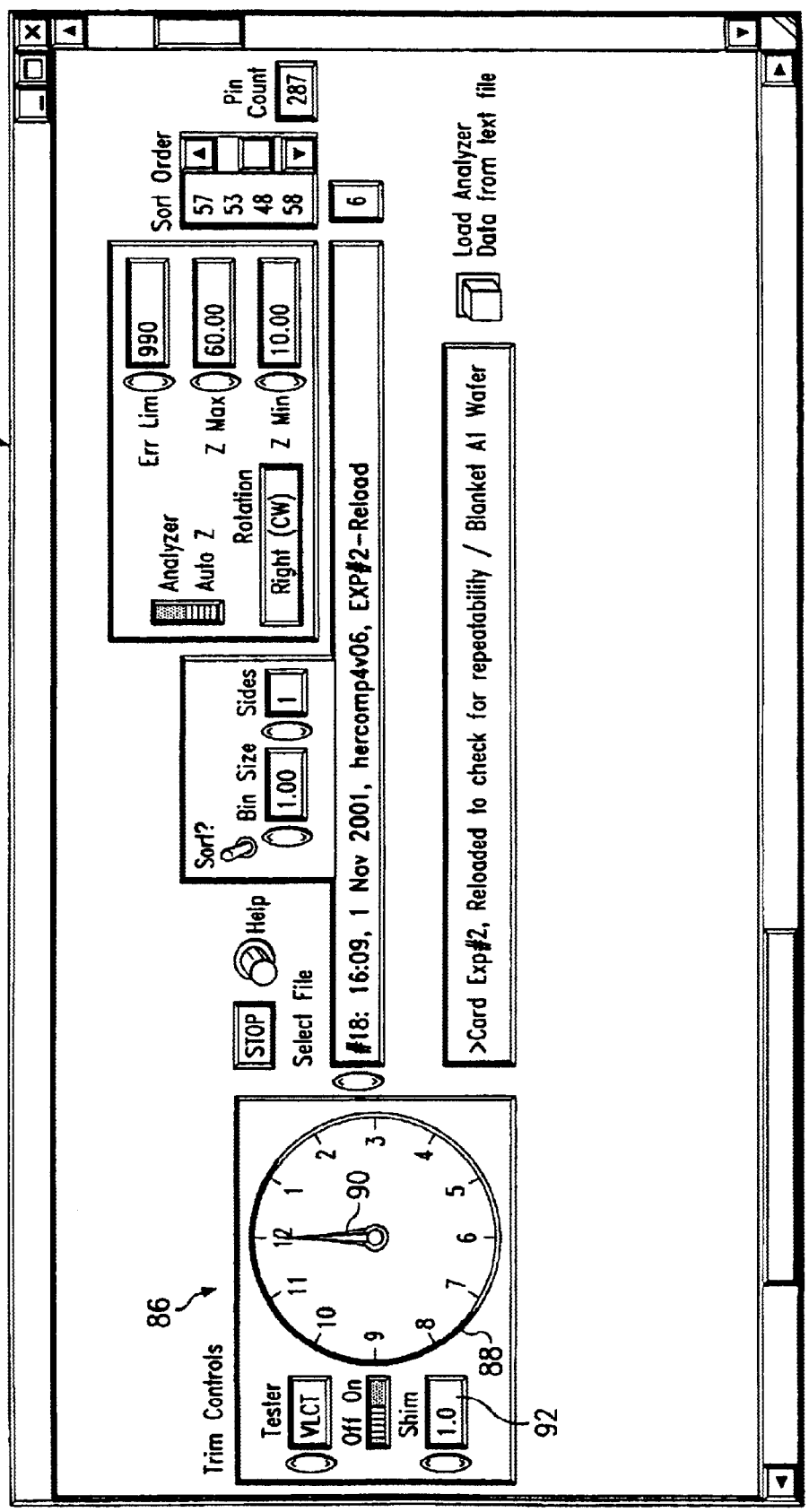
FIG. 8 is a control panel display provided by a software application of the first embodiment.

FIG. 8 shows a user interface or control panel 84 display for the software program of the first embodiment. Note on the left side of the control panel display 84 of FIG. 8, there are trim controls 86 for setting the location and the thickness of a shim. In use, a user chooses a shim location on the clock dial 88 by moving the needle 90 on the clock dial 88. The user also selects a shim amount in a selection box 92 and turns on the shim simulator to instruct the software to add the shim and replot the three dimensional plot 72 and the histogram 74. Evaluating the example data shown in FIG. 6, it appears that a shim is needed at 9 o'clock. The user can change the shim amount and the shim location quickly in the control panel 84 of the software program and instantly see the simulated results of inserting the specified shim. Hence, the user can tweak the shim amount and shim location, while watching the histogram 74 and while looking at the three dimensional plot 72 until an optimum or satisfactory result is achieved. In the current embodiment, the three dimensional plot 72, the histogram 74, and the control panel 84 are linked together by the software application and tiled on screen simultaneously.

Figure 9:
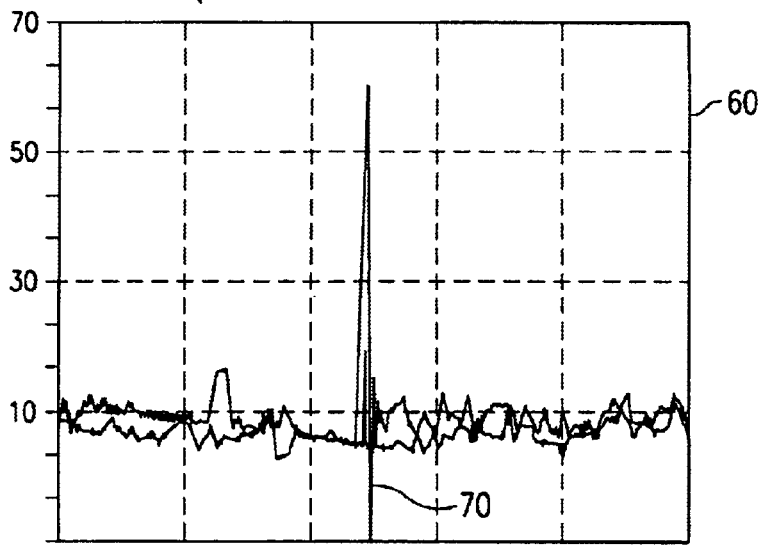
FIG. 9 is a front view of a plot for the sorted data of FIGS. 4–6 after a simulated shim insertion.
Figure 10:
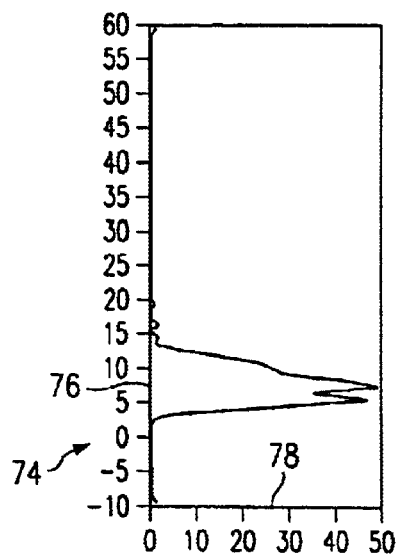
FIG. 10 is a histogram of the sorted data plotted in FIG. 9 after the simulated shim insertion.
Figure 11:
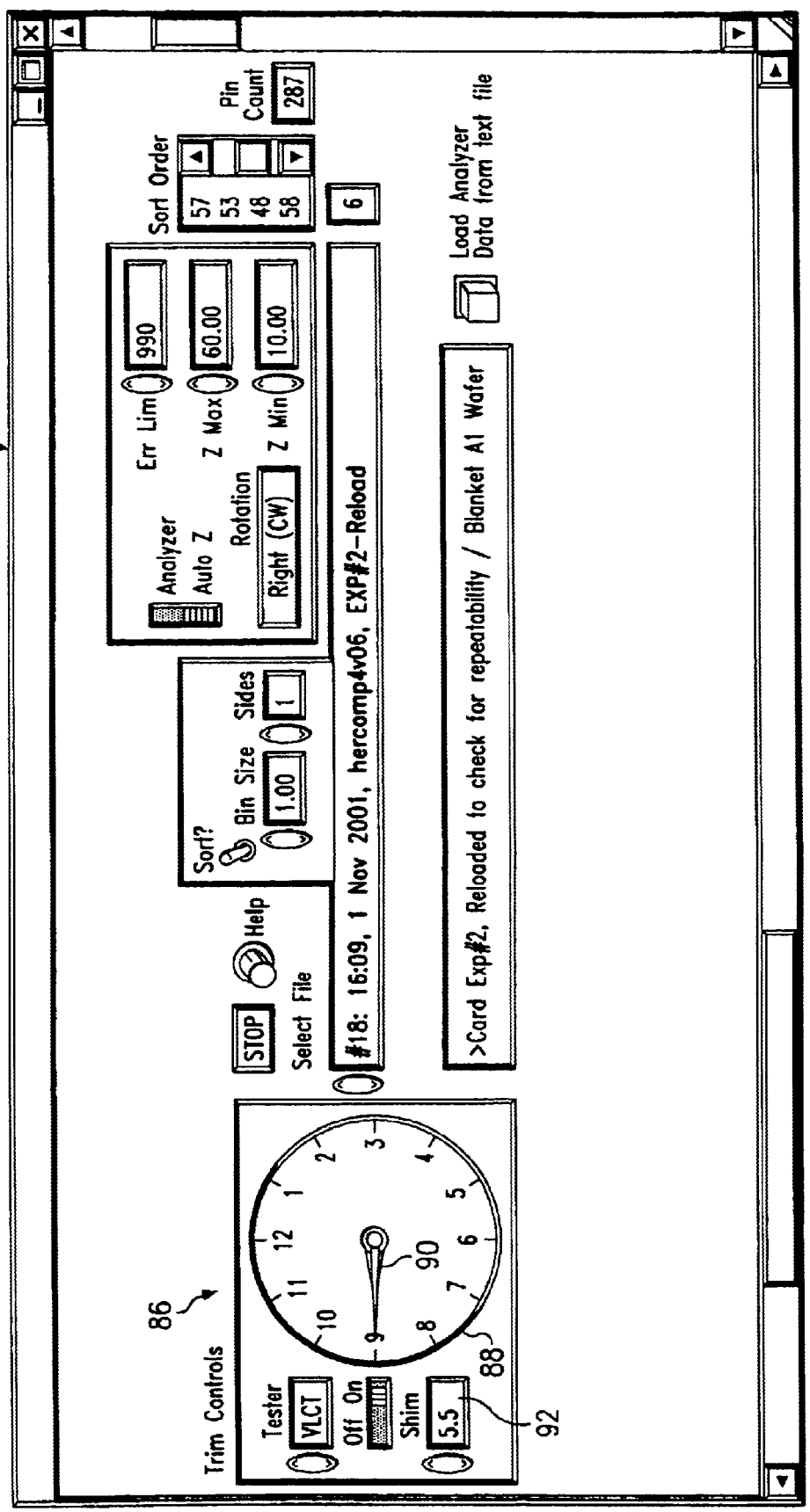
FIG. 11 is the control panel display of FIG. 8 showing the shim adjustments made on the control panel during the shim insertion simulation.

FIGS. 9–11 show the simulation results for inserting a 5.5 mils (0.0055") shim at 9 o'clock. FIG. 11 shows the changes made on the control panel 84 to produce the plot 72 of FIG. 9 and the histogram 74 of FIG. 10. Comparing FIG. 6 with FIG. 9 reveals an improvement in the parallelism. Comparing FIG. 7 with FIG. 10 reveals an improvement in the histogram 74, i.e., tighter and more uniform Gaussian distribution. Thus, based on the results of the simulation, an operator could insert a 5.5 micron shim at 9 o'clock and expect to see an improvement in the parallelism of the set-up. Then, subsequent testing with the corrected set-up should reveal the accuracy of the simulation.

The ability to simulate the insertion of shims on the software program may save a lot of set-up time and reduce trial and error in set-up adjustments, which will reduce downtime and decrease the potential for contaminating or disturbing other aspects of the set-up. Thus, the ability to simulate the insertion of a shim provides a number of advantages.

Figure 12:
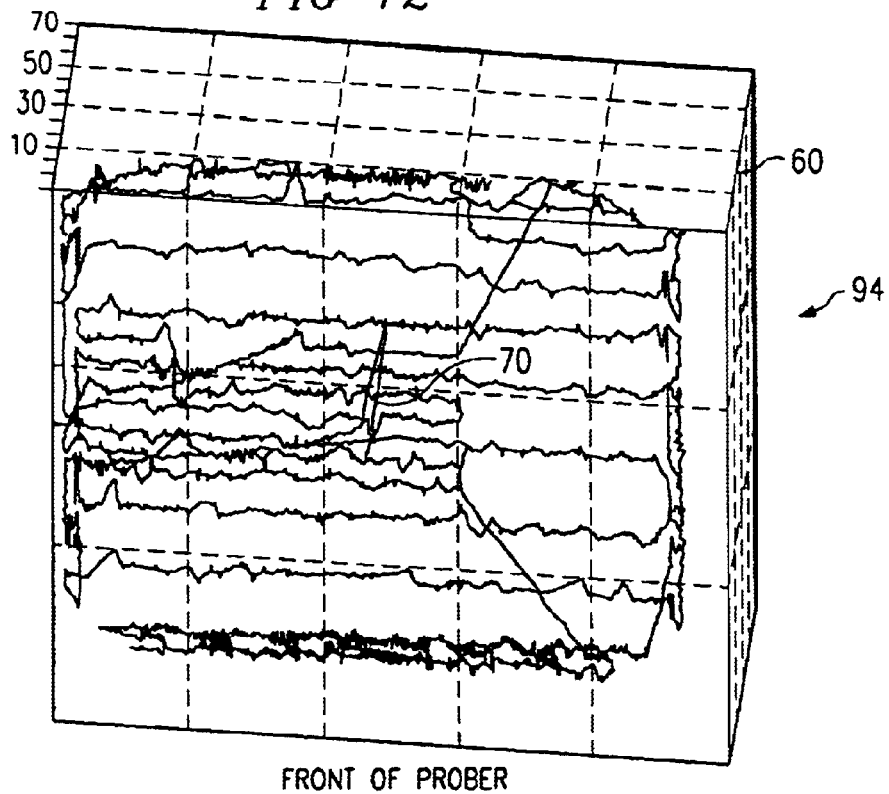
FIG. 12 is a front perspective view of yet another set of sorted data plotted using the first embodiment of the present invention.
Figure 13:
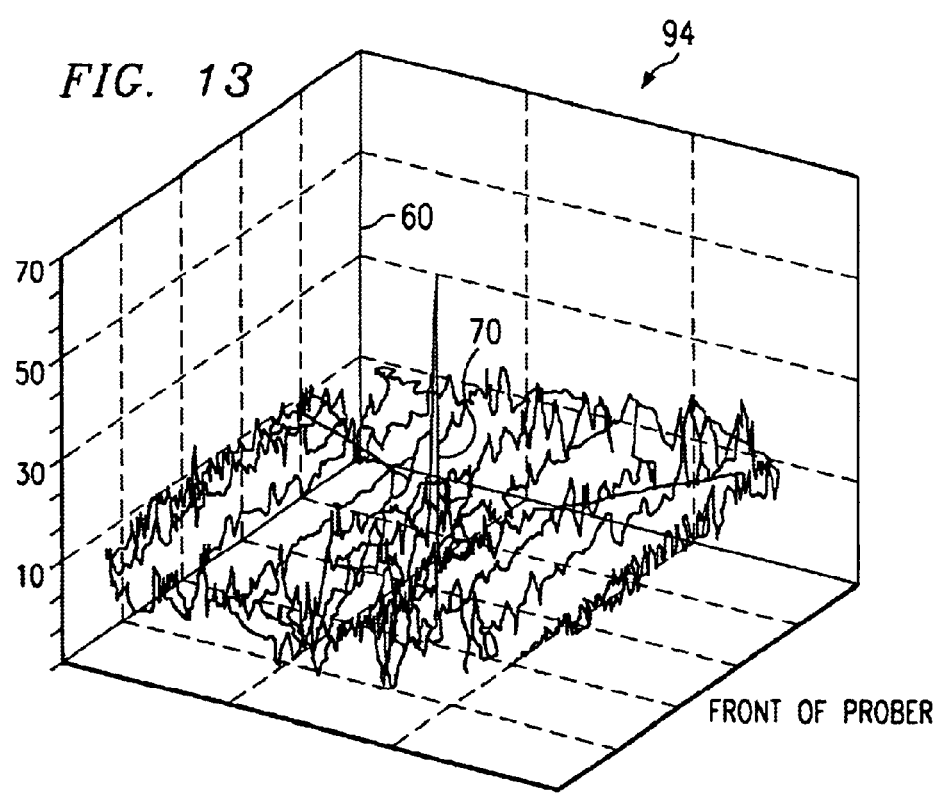
FIG. 13 is a histogram of the sorted data plotted in FIG. 12.
Figure 14:
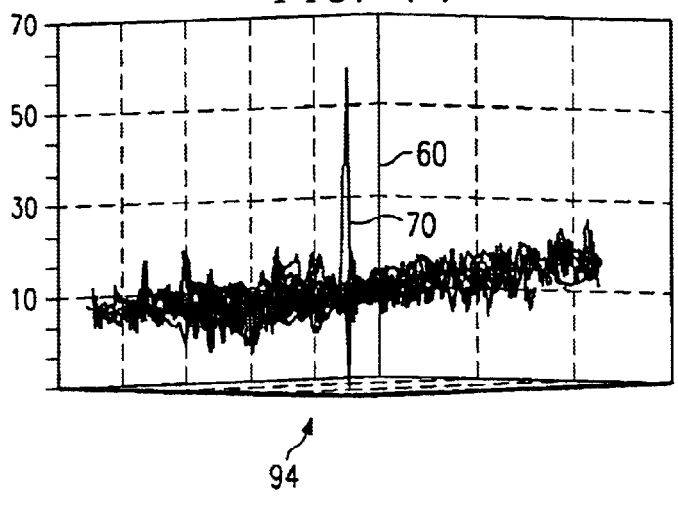
FIG. 14 is a front perspective view of the sorted data of FIG. 12 after a simulated shim insertion.
Figure 15:
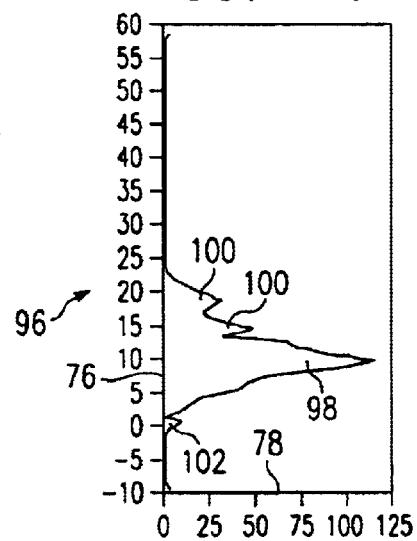
FIG. 15 is a histogram of the sorted data plotted in FIG. 14 after the simulated shim insertion.
Figure 16:
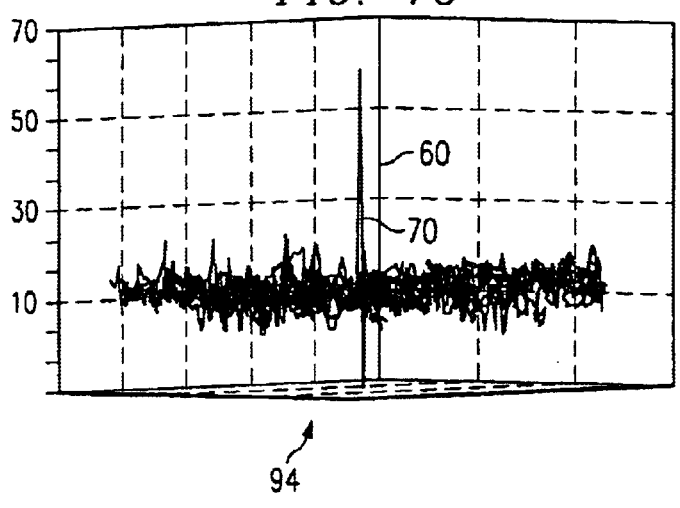
FIG. 16 is a top perspective view of still another set of sorted data from a probe card with vertical probe pins plotted using the first embodiment of the present invention.
Figure 17:
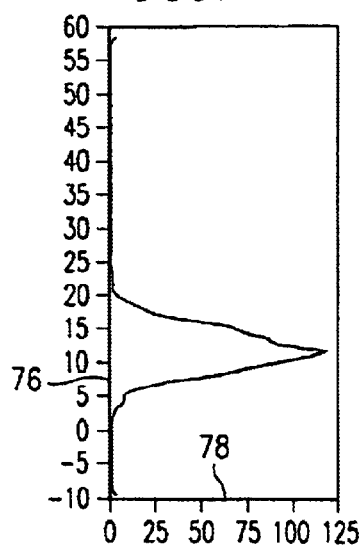
FIG. 17 is a perspective view of the plot of FIG. 16.

FIGS. 12–14 show a three dimensional plot 94 (from three different angles) of sorted data from a vertical probe card (not shown) having piston-style probe pins. In FIG. 14 the plot 94 has been rotated so that the data is viewed from about 8 o'clock to 2 o'clock to reveal a tilt, where 5 o'clock is higher than 11 o'clock. The histogram 96 of FIG. 15, which is the same data plotted in FIGS. 12–14, reveals a distribution having one large spike 98, two medium size spikes 100 on the high side, and one small spike 102 on the low side. By "inserting a shim" in the software program, the simulated results reveal a significant improvement in FIGS. 16 and 17. The plot 94 of FIG. 16 has a noticeable improvement in parallelism compared to FIG. 14. But perhaps more revealing is the improvement in the histogram 96 of FIG. 17 compared to that of FIG. 15. The histogram 96 of FIG. 17 has a nice Gaussian distribution, which shows that the tilt has been corrected by an optimal amount. Thus, an embodiment of the present invention may be useful for evaluating all types of probe cards.

If the probe tip array 48 is tilted, one side will wear faster than the other. By improving or maintaining parallelism, the probe tip array 48 will wear more evenly during use, which will extend the life of the probe card 32. Most of the wear on the probe tip array 48 occurs during the cleaning process. To clean the probe tip array 48, the probe needles 50 are rubbed against an abrasive cleaning plate 106 or against a cleaning media. There are many different types of cleaning media that may be used, such as a brush, a gel with sand embedded therein, or an abrasive surface, for example. Typically the cleaning plate 106 is located on a corner of the wafer chuck 44, as shown in FIG. 1 for example, and will have a separate mechanism for adjusting it's parallelism, apart from the wafer chuck. In the current embodiment, the cleaning plate 106 has a very fine abrasive surface and very hard flat surface. As the probe tips 48 become contaminated during use in testing dies, the abrasive cleaning process is used remove the contaminates from the probe tips. During the cleaning process, the tips 48 of the needles 50 are slightly worn in an effort to remove all contaminates. However, if the probe tip array 48 is not perfectly parallel with the cleaning plate 106, the probe tips 48 on one side may be worn too much before the other side ever makes contact with the cleaning plate 106. Preferably a cleaning plate 106 with an electrically conductive surface (e.g., tungsten carbide cleaning plate surface) is used so that electrical contact between the probe tips 48 and the cleaning plate 106 may be detected and measured. Hence, the first embodiment of the present invention may be used to evaluate planarity and parallelism relative to the cleaning plate 106, which will help ensure that the cleaning plate 106 evenly wears the probe tips 48. Using an embodiment of the present invention, the useful life of probe cards are expected to increase by about three to six times the current life of probe cards. This increased life for probe cards may thus lead to huge equipment cost savings.

Another benefit of the first embodiment of the present invention is that the data regarding planarity and/or parallelism provided by an analyzer can be compared to actual data while testing an actual wafer 44 during manufacturing. The analyzer tests the probe cards 32 after they are made by the probe manufacturer before the probe cards 32 are shipped to customers. Also, the probe manufacturers and/or probe card analyzers may use the first embodiment to test probe cards 32 to better improve products delivered to users. Furthermore, if the planarizing step at the manufacturer is not parallel, the error of the manufacturer may be distinguished from damage or excessive wear from tilted use by a user.

While evaluating a probe card 32 using an embodiment of the present invention, relative height (z direction) information may be used, but using absolute height measurements are preferable. By tracking the absolute height (z value), the wear history of a probe card 32 may be better tracked for evaluation of the testing machine 30 and for gaining a better understanding of the wear life of a probe card 32. For example, each time a probe card is used (or some of the times a probe card is used), a sorted group of data may be obtained and stored for the probe card (as described above for the first embodiment). Then during the life of the probe card, a set of the sorted data groups will develop for the probe card. When the set of sorted data groups are viewed together, for example, it should reveal the wear patterns of the probe card during its life. Such information may be useful in evaluating numerous things, such as the quality of the probe card, the quality of set-up and alignment procedures, and/or the quality of technicians' efforts to keep the machines in top working order, for example.

Figure 18:
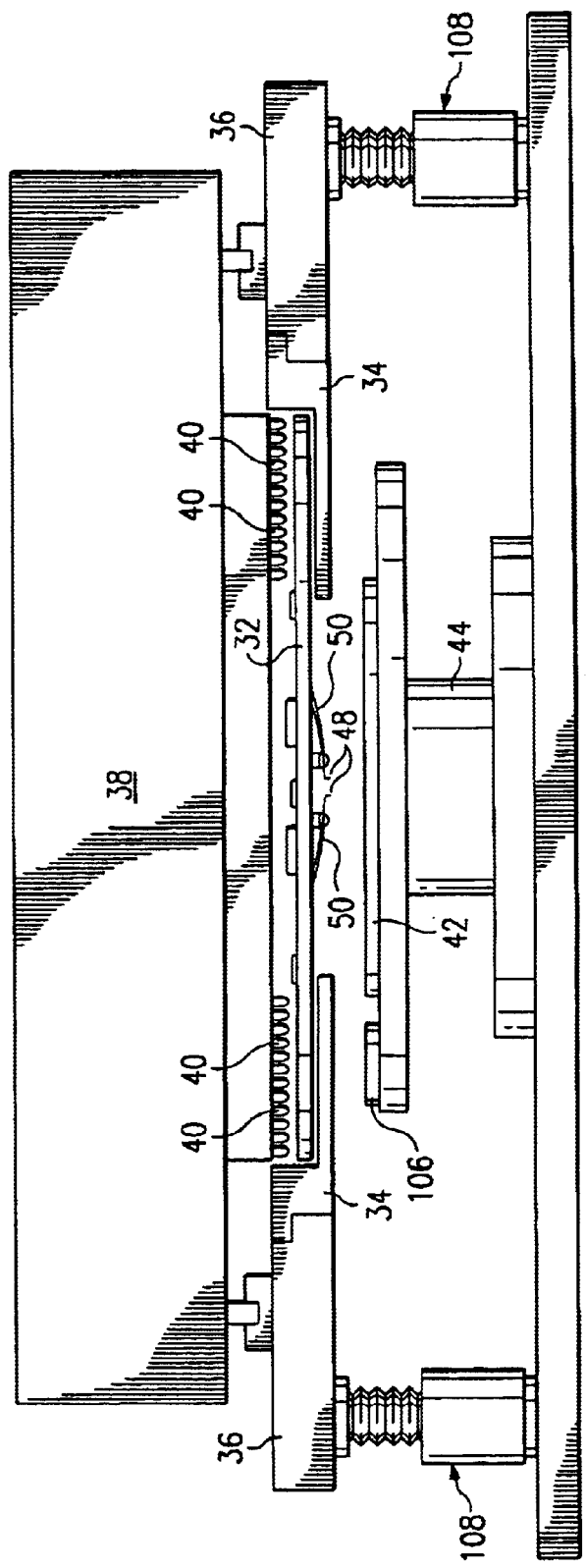
FIG. 18 is a probe testing machine in accordance with other embodiments of the present invention.

Although the first embodiment focuses on adjusting the set-up by inserting shims, other means of adjusting the set-up may be used to correct for tilt. For example, instead of inserting a shim, the head plate 36 and/or the ring insert 34 may be tilted to correct for lack of parallelism between the probe tip array 48 and a selected surface (e.g., wafer 44, cleaning plate 106). A second embodiment of the present invention is shown in FIG. 18. In the second embodiment, the conventional support columns 46 (see FIG. 1) have been replaced with screw actuators 108 driven by electric motors. The actuators 108 may be linked to the software application via an interface card and motor controller (not shown), for example. A button or control dial (not shown) may be added to the control panel 84 of the software program to allow an operator to adjust the tilt of the head plate 36, and thus the probe tip array 48, using the actuators 108. In alternative, the actuators 108 may be driven by other means, such as hydraulic or pneumatic. Also, the actuator mechanism may vary, such as a piston configuration for example.

With the second embodiment, a user may view and evaluate the planarity and parallelism, as with the first embodiment, then simulate a tilt adjustment (if needed) at the actuators using the software program to find the optimum amount of movement needed at one or more of the actuators while viewing the simulated results of the tilting on a redrawn three dimensional plot and histogram (as discussed above regarding the first embodiment). When the optimum tilt parameters are found, the user may then send a command to the actuators 108 (manually or using the software) for the actuator 108 to adjust the tilt of the head plate 36. An advantage of having a machine 30 with adjustable tilt is that the parallelism can be improved or corrected without the need for a technician to handle the probe card. Often, management may not want technicians inserting shims for probe cards 32 due to risks associated with installing shims and handling the probe card 32.

In a third embodiment (see FIG. 18 again), the software program may evaluate the sorted data and determine the optimum tilt or the optimum shim amount and placement automatically using an iterative algorithm, for example. Such an iterative algorithm may use the distribution of the histogram to determine the optimum tilt or shim amount and placement, for example. A fourth embodiment (see FIG. 18 again) may have all the features of the third embodiment plus the software program may have the ability to automatically send a command to the actuators 108 to adjust the head plate tilt, on-the-fly and without operator intervention. Hence in the fourth embodiment, the head plate 36 may be continually adjusted as needed to strive for maintaining an optimum tilt or lack of tilt (parallelism) for the head plate 36 at all times.

A fifth embodiment (not shown) may be the same as the third or fourth embodiment, except that the actuators 108 may be located in different locations. For example, instead of replacing the conventional support columns 46, the actuators 108 may be located between the ring insert 34 and the head plate 36. Thus, as the ring insert 34 is tilted relative to head plate 36, the probe tip array 48 in turn would be tilted relative to the die and wafer 42 on the wafer chuck 44. In a sixth embodiment (not shown), the wafer chuck 44 may be tilted using an actuator mechanism.

In the first embodiment of the present invention, LabView® software by National Instruments, Inc. of Austin, Tex. is used to provide the software application. LabView® is a graphical programming tool with numerous other uses and may be considered its own unique "computer language." One of ordinary skill in the art with the benefit of this disclosure will realize that numerous other types of software packages or languages may be used as a tool to provide a software program of an embodiment of the present invention.

It will be appreciated by those skilled in the art having the benefit of this disclosure that an embodiment of the present invention provides a system and method for evaluating the planarity of an array of probe tips and the parallelism of the probe tip array relative to a selected surface. It should be understood that the drawings and detailed description herein are to be regarded in an illustrative rather than a restrictive manner, and are not intended to limit the invention to the particular forms and examples disclosed. On the contrary, the invention includes any further modifications, changes, rearrangements, substitutions, alternatives, design choices, and embodiments apparent to those of ordinary skill in the art, without departing from the spirit and scope of this invention, as defined by the following claims. Thus, it is intended that the following claims be interpreted to embrace all such further modifications, changes, rearrangements, substitutions, alternatives, design choices, and embodiments.

What is claimed is:

1. A method of evaluating the planarity of an array of probe tips on a probe card and parallelism of the array of probe tips relative to a selected surface, comprising:

moving the probe tip array and the selected surface relative to each other in spaced increments;

testing for electrical contact between at least some of the probe tips and the selected surface for at least some of the increments;

for each probe tip tested at a given increment, recording whether electrical contact occurs between the tested probe tips and the selected surface;

sorting the recorded data to create a sorted data group comprising a shortest distance where electrical contact occurred between each probe tip tested and the selected surface during the testing; and plotting the sorted data group on a three dimensional cartesian coordinate system, wherein x and y values for each data point generally correlate to a location of a corresponding probe tip relative to the other probe tips, and wherein a z value for each data point is a shortest distance where electrical contact occurred between the corresponding probe tip and the selected surface during the testing.

2. The method of claim 1, wherein the spacing between the increments is the same.

3. The method of claim 1, wherein the spacing between the increments varies among at least some of the increments.

4. The method of claim 1, wherein the selected surface moves toward the probe tip array in a direction generally perpendicular to the selected surface.

5. The method of claim 1, wherein the selected surface comprises an array of pads formed on a semiconductor wafer.

6. The method of claim 1, wherein the selected surface comprises a wafer.

7. The method of claim 1, wherein the selected surface comprises a reference plate used for calibration.

8. The method of claim 1, wherein the selected surface comprises a cleaning plate.

9. The method of claim 1, wherein the selected surface comprises a plate with an abrasive and electrically conductive surface.

10. The method of claim 1, further comprising:

plotting a histogram for the sorted data group, wherein the histogram has a first axis for the shortest distance where electrical contact occurred between each probe tip tested and the selected surface during the testing, and the histogram has a second axis for the number of data points with like shortest distances at each tested increment for the sorted data group.

11. The method of claim 1, further comprising:

rotating the cartesian coordinate system to view the plotted data from a different angle.

12. A method of producing a semiconductor device, comprising:

testing at least a portion of the semiconductor device using the method of claim 1 during production of the semiconductor device.

13. A method of simulating the results of tilting a probe card relative to a selected surface, comprising:

plotting data on a three dimensional cartesian coordinate system, wherein x and y values for each data point generally correlate to a location of a corresponding probe tip of an array of probe tips on the probe card relative to other probe tips on the probe card, and wherein a z value for each data point is a shortest distance where electrical contact occurred between the corresponding probe tip and the selected surface during testing for electrical contact between the probe tip array and the selected surface;

evaluating the tilt of the probe tip array based on a plot of the data on the cartesian coordinate system;

tilting the data on the cartesian coordinate system to simulate an actual tilting action possible on a testing machine housing the probe card; and replotting the tilted data on the cartesian coordinate system.

14. The method of claim 13, further comprising:
rotating the cartesian coordinate system to view the plotted data from a different angle.

15. The method of claim 13, further comprising:
plotting a histogram for the sorted data group, wherein the histogram has a first axis for the shortest distance where electrical contact occurred between each probe tip tested and the selected surface during the testing, and the histogram has a second axis for the number of data points with like shortest distances at each tested increment for the sorted data group.

16. A method of producing a semiconductor device, comprising:
testing at least a portion of the semiconductor device using the method of claim 13 during production of the semiconductor device.

17. A method of aligning a cleaning surface with an array of probe tips on a probe card, comprising:
providing an electrically conductive cleaning surface;
testing for a position where electrical contact occurs between at least some of the probe tips of the probe tip array and the cleaning surface;
recording data for the positions where electrical contact occurs for each probe tip tested;
sorting the recorded data to create a sorted data group comprising a shortest distance where electrical contact occurred between each probe tip tested and the cleaning surface during the testing; and
plotting the sorted data group on a three dimensional cartesian coordinate system, wherein x and y values for each data point generally correlate to a location of a corresponding probe tip relative to the other probe tips, and wherein a z value for each data point is a shortest distance where electrical contact occurred between the corresponding probe tip and the cleaning surface during the testing;
evaluating the tilt of the cleaning surface relative to the probe tip array based on a plot of the sorted data group on the cartesian coordinate system; and
if needed, adjusting the tilt of the cleaning surface relative to the probe tip array based on the evaluation.

18. The method of claim 17, further comprising:
rotating the cartesian coordinate system to view the plotted data from a different angle.

19. The method of claim 17, further comprising:
plotting a histogram for the sorted data group, wherein the histogram has a first axis for the shortest distance where electrical contact occurred between each probe tip tested and the cleaning surface during the testing, and the histogram has a second axis for the number of data points with like shortest distances at each tested increment for the sorted data group.

20. The method of claim 19, further comprising:
viewing the changes on the histogram plot as the sorted data is tilted; and
evaluating the tilt of the probe tip array based on the histogram, wherein an optimum tilt position should yield a relatively tight and uniform Gaussian distribution on the histogram plot.

21. A system, comprising:
a support member adapted to hold and retain a probe card, wherein the probe card has an array of probe tips extending therefrom;
a computer system comprising a software program, the software program providing instructions for causing the computer system to perform a method comprising:
testing for a position where electrical contact occurs between at least some of the probe tips of the probe tip array and a selected surface;
recording data for the positions where electrical contact occurs for each probe tip tested;
sorting the recorded data to create a sorted data group comprising a shortest distance where electrical contact occurred between each probe tip tested and the selected surface during the testing; and
plotting the sorted data group on a three dimensional cartesian coordinate system, wherein x and y values for each data point generally correlate to a location of a corresponding probe tip relative to the other probe tips, and wherein a z value for each data point is a shortest distance where electrical contact occurred between the corresponding probe tip and the selected surface during the testing.

22. The system of claim 21, further comprising a wafer chuck for supporting and moving a wafer relative to the probe tip array, wherein the selected surface is the wafer.

23. The system of claim 21, further comprising a cleaning plate having a cleaning surface, wherein the selected surface is the cleaning surface of the cleaning plate.

24. The system of claim 21, wherein the support member comprises:
a head plate supported by support columns; and
a ring insert fitting within the head plate, wherein the probe card fits within and retained by the ring insert.

25. The system of claim 21, wherein the support member comprises:
a head plate supported by electrically controllable actuators;
a ring insert fitting within the head plate, wherein the probe card fits within and retained by the ring insert.

26. The system of claim 25, wherein the method further comprises:
controlling the movement and position of the actuators; and
adjusting the tilt of the head plate relative to the selected surface using the actuators.

27. The system of claim 21, wherein the method further comprises:
plotting a histogram for the sorted data group, wherein the histogram has a first axis for the shortest distance where electrical contact occurred between each probe tip tested and the selected surface during the testing, and the histogram has a second axis for the number of data points with like shortest distances at each tested increment for the sorted data group.

28. The system of claim 21, wherein the method further comprises:
simulating the insertion of a shim between the probe card and the support member; and
replotting the sorted data group on the cartesian coordinate system after simulating the shim insertion.

29. The system of claim 21, wherein the method further comprises:
rotating the cartesian coordinate system to view the plotted data from a different angle.

* * * * *